United States Patent
Aakalu et al.

[11] Patent Number: 5,915,466
[45] Date of Patent: Jun. 29, 1999

[54] HEAT DISSIPATING STRUCTURE FOR AN ELECTRICAL ASSEMBLY

[75] Inventors: Nandakumar G. Aakalu, Suffern, N.Y.; Gihyun Cho, Franklin Lakes, N.J.; Richard Sander Costa, Bedminster, N.J.; Peter J. Massa, Leonia, N.J.; Walter J. Picot, Randolph, N.J.; Daniel Plaza, Mendham, N.J.

[73] Assignee: Lucent Technologies Inc., Murray Hill, N.J.

[21] Appl. No.: 09/008,726

[22] Filed: Jan. 19, 1998

[51] Int. Cl.$^6$ .................................................. H05K 7/20
[52] U.S. Cl. ................ 165/121; 165/80.3; 165/134.1; 361/690; 361/697; 361/703
[58] Field of Search ............... 165/80.3, 134.1, 165/185, 121; 361/689, 690, 697, 703

[56] References Cited

U.S. PATENT DOCUMENTS

| | | | |
|---|---|---|---|
| 3,254,281 | 5/1966 | McClain | 165/80.03 |
| 3,317,798 | 5/1967 | Chu et al. | 165/80.03 |
| 4,535,386 | 8/1985 | Frey, Jr. et al. | 361/389 |
| 4,644,443 | 2/1987 | Swensen et al. | 361/384 |
| 4,858,069 | 8/1989 | Hughes | 361/384 |
| 5,249,706 | 10/1993 | Szabo | 222/20 |
| 5,513,071 | 4/1996 | La Violette et al. | 361/703 |
| 5,592,363 | 1/1997 | Atarashi et al. | 361/689 |
| 5,812,373 | 9/1998 | Hwang | 361/704 |

*Primary Examiner*—Allen Flanigan

[57] ABSTRACT

An enclosure containing heat generating electrical components is provided with exterior heat fins and is enclosed within a perforated cover. The heat fins are generally planar and parallel to define vertical channels between adjacent pairs of fins. The fins are formed with a plurality of aligned notches to define a plurality of horizontal channels. The perforations in the cover are arrayed along a plurality of horizontal lines, with at least one of the horizontal lines overlying each of the horizontal channels.

5 Claims, 2 Drawing Sheets

HEAT DISSIPATING STRUCTURE FOR AN ELECTRICAL ASSEMBLY

BACKGROUND OF THE INVENTION

This invention relates to electrical assemblies which generate heat and which are contained within an enclosure and, more particularly, to structure for dissipating heat from such assemblies.

An electrical assembly utilized as a base station for a cellular telephone system is typically mounted outdoors, where it is exposed to the environment. Such an assembly includes heat generating components and is mounted within an enclosure, and therefore some means for dissipating the heat must be provided. In addition, such an assembly is usually provided with an outer cover which acts as a solar shield and which is beneficial in sheltering the unit from solar heat, but such a cover can impede the dissipation of heat from the assembly. It is known to provide a heat sink including heat conducting fins on the enclosure under the solar shield for dissipating heat generated within the enclosure. These fins are typically planar and parallel to define vertical channels between adjacent pairs of the fins. The vertical channels act as chimneys which allow heated air to rise and escape through appropriate openings at the top of the shield. However, air which is heated by the fins at the bottom of a chimney and travels to the top of the chimney has more and more heat added to it as it travels upward, thereby adversely impacting heat transfer near the top of the assembly. It would therefore be desirable to provide structure which does not suffer from this disadvantage.

SUMMARY OF THE INVENTION

In accordance with the principles of this invention, there is provided structure for removing heat from a heat generating and dissipating electrical assembly. The assembly is contained within an enclosure defining a vertical axis when mounted. The structure comprises an array of heat conducting parallel planar fins secured to an exterior wall of the enclosure. The fins are aligned parallel to the vertical axis to define a plurality of vertical channels between adjacent pairs of fins. The fins are formed with a plurality of aligned notches to define a plurality of horizontal channels. A perforated cover is over and spaced from the fins, with the perforations on the cover being arrayed along a plurality of horizontal lines each overlying a respective one of the horizontal channels.

In accordance with an aspect of this invention, the perforations of the cover are substantially elliptical in shape with a horizontal major axis.

In accordance with another aspect of this invention, the cover has additional perforations arrayed along an additional plurality of horizontal lines overlying the fins between adjacent pairs of the plurality of horizontal channels.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
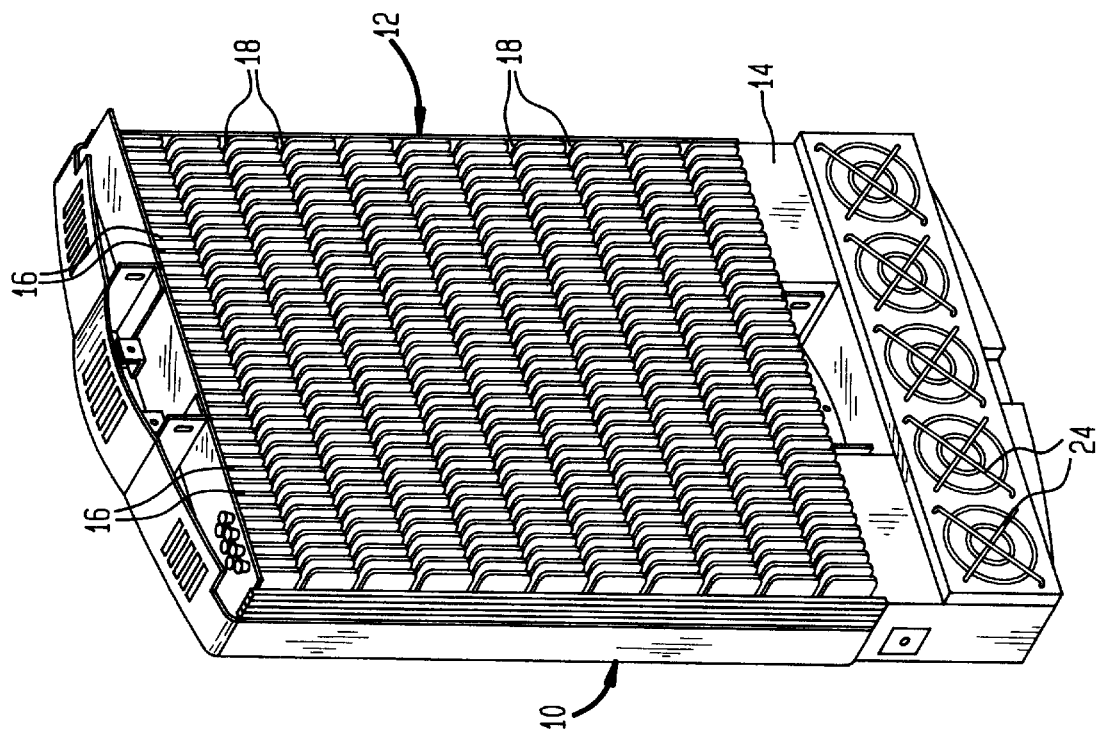
FIG. 1 is a perspective view showing an electrical assembly enclosure having heat conducting fins in accordance with the present invention.

Referring now to the drawings, FIG. 1 shows an electrical assembly enclosure 10 with heat conducting fins 12 according to the present invention on an exterior wall 14 of the enclosure 10. While FIG. 1 only illustrates fins 12 on one exterior wall 14 of the enclosure 10, the enclosure 10 is generally in the shape of a parallelepiped and an array of fins will typically also be provided on the exterior wall opposed to the exterior wall 14. According to the present invention, the fins 12 comprise an array of heat conducting parallel planar fins which are aligned parallel to a vertical axis when the enclosure 10 is mounted as intended. Thus, between adjacent pairs of the fins 12 a plurality of vertical channels 16 are defined. The distal edge of each of the fins 12 remote from the exterior wall 14 is preferably a substantially straight line, and all such edges (lines) lie in a single plane. However, each of the fins is formed with a plurality of notches in its distal edge. These notches are aligned with the notches of all the other fins to define a plurality of horizontal channels 18.

Figure 2:
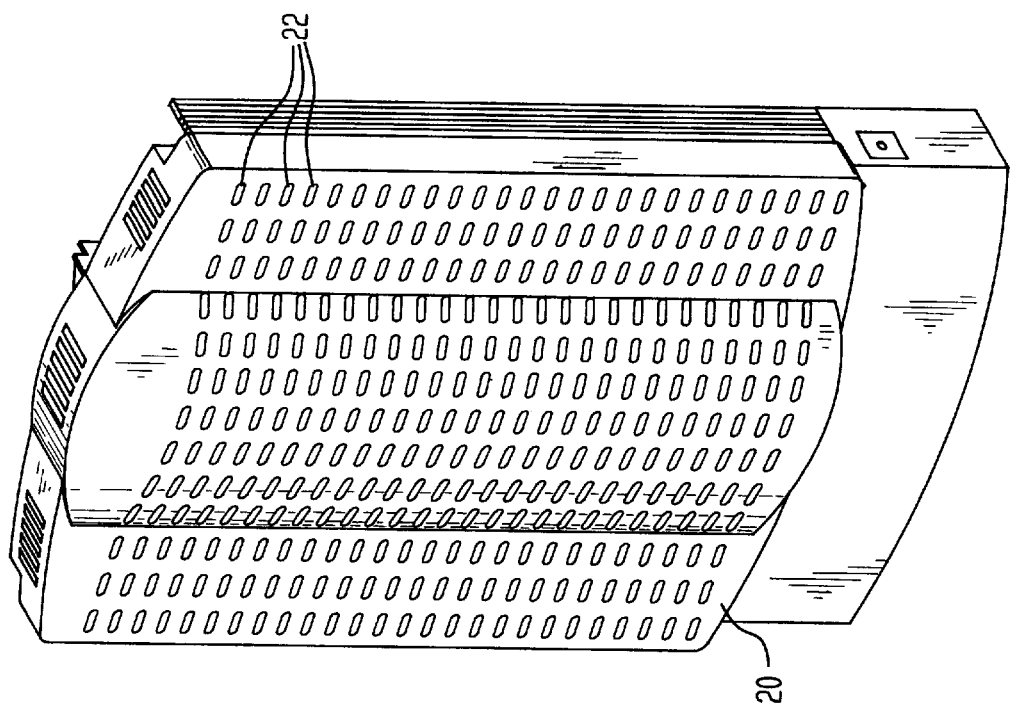
FIG. 2 is a perspective view showing the structure of FIG. 1 enclosed within a cover according to the present invention.

To protect the enclosure 10, it is encased within a cover, or solar shield, 20, as shown in FIG. 2. The cover 20 is over and spaced from the fins 12 and has an array of relatively small perforations 22 therethrough. Preferably, the perforations 22 are substantially elliptical in shape with a horizontal major axis. In any event, the perforations 22 are arrayed along a plurality of horizontal lines. The horizontal lines are so located that each of the horizontal channels 18 has at least one of the horizontal lines overlying it. In addition, between those horizontal lines overlying the horizontal channels 18, there are additional horizontal lines of perforations.

The usual mounting of the electrical assembly of concern is at a slight elevation with respect to the ground where there is usually a light wind (3 to 5 mph) in the vicinity of the assembly. The aforedescribed structure harnesses this wind for cooling the assembly, with the solar shields also acting as wind modulators. Wind flowing over the blunt shape of the enclosure creates a high pressure dome of air around it. This dome can prevent cool air getting to the inlet areas of the heat sinks, thus leading to overheating. Without wind modulation, the high pressure dome created around the assembly by the wind can disrupt the natural convection cooling process. The perforations through the cover 20 on the front and back of the enclosure 10 are used to drive the wind through the fins. The horizontal channels 18 provide channels for the cross wind. Slots or openings at the top and bottom of the front and back solar shields provide necessary flow passages for natural convection and also function as a pressure equalizer during a vertical wind situation. The pressure on the side of the cover 20 facing into the wind is higher than the pressure on the side of the cover 20 facing away from the wind. Accordingly, the perforations in the cover 20 will allow air to move under the cover 20 from the higher pressure side to the lower pressure side. Since the direction of the wind is random, the perforations are provided on all sides of the enclosure 10.

Figure 3:
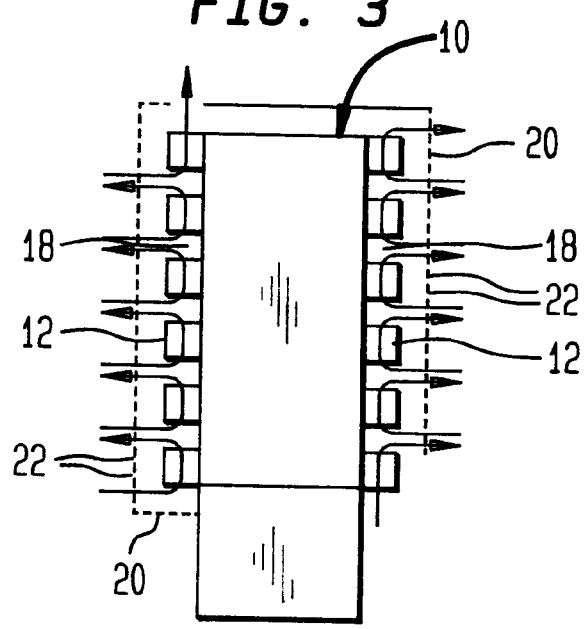
FIG. 3 is a side view schematically depicting air currents within the structure shown in FIG. 2.

In addition, the perforations 22 in the cover 20 allow fresh air to enter the vertical channels 16 during the natural convection process, as well as allowing for pressure equalization during a head-on wind situation. As shown by the arrows in FIG. 3, fresh air can enter perforations 22 aligned with horizontal channels 18, pass into the vertical channels 16 (see FIG. 1) and be drawn upwardly by natural convection currents and exit through perforations 22 aligned with upper horizontal channels 18. It is estimated that the use of the perforations 22 and the horizontal channels 18 improves cooling of the enclosure 10 by up to about 20%.

Figure 4:
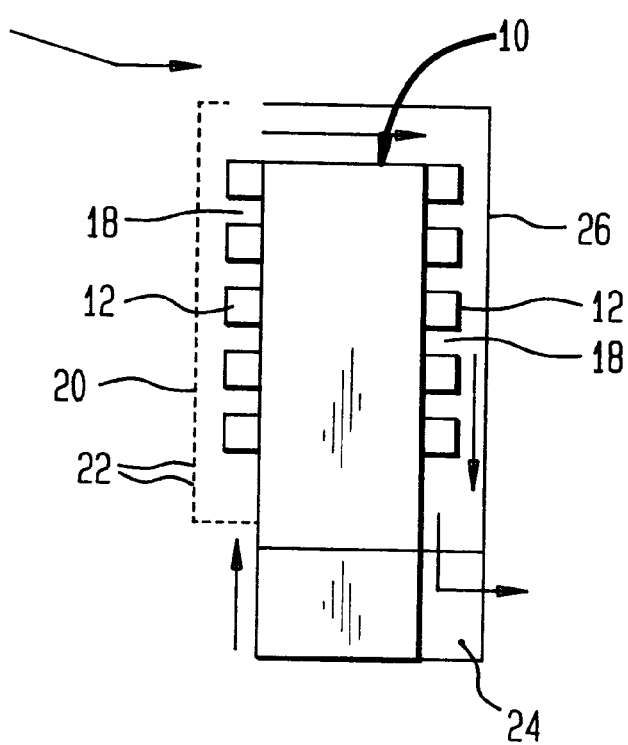
FIG. 4 is a view similar to FIG. 3 showing an alternate embodiment of the present invention.

It may be desirable to provide fans to insure air flow. In accordance with this invention, the fans 24 (FIG. 1) are installed on the outside of the enclosure 10 below the fins 12. As shown in FIG. 4, on the side of the enclosure 10 having the fans, a cover 26 is imperforate. The fans 24 are oriented to draw air downwardly in the vertical channels 16 between the fins 12 on the side of the enclosure 10 having the imperforate cover 26. Fresh air is then drawn through the perforations 22 in the cover 20 on the other side of the enclosure 10, up through the vertical channels 16 on that side of the enclosure 10, across the top of the enclosure 10 and down through the vertical channels 16 to the fans 24. The horizontal channels 18 function to equalize the flow across the full width of the heat sink made up of the fins 12. This equalization is most beneficial in the event one of the fans 24 becomes non-operative.

Accordingly, there has been disclosed improved structure for dissipating heat from an electrical assembly. While exemplary embodiments of the present invention have been disclosed herein, it is understood that various modifications and adaptations to the disclosed embodiments will be apparent to those of ordinary skill in the art and it is intended that this invention be limited only by the scope of the appended claims.

What is claimed is:

1. Structure for removing heat from a heat generating and dissipating electrical assembly, the assembly being contained within an enclosure, the structure comprising:

an array of heat conducting parallel planar fins secured to an exterior wall of the enclosure, the fins being aligned parallel to a vertical axis when the enclosure is mounted to define a plurality of vertical channels between adjacent pairs of fins, the fins being formed with a plurality of aligned notches to define a plurality of horizontal channels; and a perforated cover over and spaced from said fins, the perforations of said cover being arrayed along a plurality of horizontal lines, with at least one of said plurality of horizontal lines overlying each of said horizontal channels.

2. The structure according to claim 1 wherein the perforations of said cover are substantially elliptical in shape with a horizontal major axis.

3. The structure according to claim 1 wherein the edge of each fin remote from said exterior wall is a substantially straight line and all such edges lie in a single plane.

4. The structure according to claim 1 wherein the cover has additional perforations arrayed along an additional plurality of horizontal lines overlying the fins between adjacent pairs of the plurality of horizontal channels.

5. The structure according to claim 1 wherein said enclosure is generally in the shape of a parallelepiped and said fins are associated with a first major surface of said enclosure, the structure further including:

a second array of heat conducting parallel planar fins associated with a second exterior wall of said enclosure, said second exterior wall corresponding to a second major surface of said enclosure opposed to said first major surface, said second array of fins being aligned parallel to the vertical axis to define a second plurality of vertical channels between adjacent pairs of said second array of fins;

an imperforate cover over and spaced from said second array of fins; and a fan mounted to said enclosure below said second array of fins, said fan being oriented to draw air downwardly in said second plurality of vertical channels.

* * * * *

UNITED STATES PATENT AND TRADEMARK OFFICE
CERTIFICATE OF CORRECTION

PATENT NO. : 5,915,466
DATED : Jun. 29, 1999
INVENTOR(S) : Nandakumar G. Aakalu, et al It is certified that error appears in the above-identified patent and that said Letters Patent is hereby corrected as shown below:

On title page, item [75] should read --Nandakumar G. Aakalu, Suffern, N.Y.;
Daniel Plaza, Mendham, N.J.--

Signed and Sealed this

Fourteenth Day of December, 1999

*Attest:*

Q. TODD DICKINSON

*Attesting Officer*  Acting Commissioner of Patents and Trademarks